United States Patent
Kim

(10) Patent No.: US 9,966,119 B1
(45) Date of Patent: May 8, 2018

(54) REFERENCE SELECTION CIRCUIT

(71) Applicant: SK hynix Inc., Icheon-si, Gyeonggi-do (KR)

(72) Inventor: Young Joo Kim, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/488,790

(22) Filed: Apr. 17, 2017

(30) Foreign Application Priority Data

Oct. 31, 2016 (KR) ...................... 10 2016 014 3070

(51) Int. Cl.
G11C 5/14 (2006.01)
G11C 7/12 (2006.01)
G11C 29/00 (2006.01)
G11C 7/10 (2006.01)

(52) U.S. Cl.
CPC ................ G11C 7/12 (2013.01); G11C 5/147 (2013.01); G11C 7/10 (2013.01); G11C 29/78 (2013.01)

(58) Field of Classification Search
CPC ...................................................... G11C 5/147
See application file for complete search history.

(56) References Cited

U.S. PATENT DOCUMENTS

| | | | | | |
|---|---|---|---|---|---|
| 5,077,518 | A | * | 12/1991 | Han | G05F 1/465 323/275 |
| 5,295,112 | A | * | 3/1994 | Taniguchi | G11C 5/147 365/177 |
| 5,463,588 | A | * | 10/1995 | Chonan | G11C 5/147 365/189.09 |
| 5,889,716 | A | * | 3/1999 | Hashimoto | G11C 11/5621 365/189.05 |
| 6,751,132 | B2 | * | 6/2004 | Jang | G11C 5/146 365/189.09 |
| 7,012,840 | B2 | * | 3/2006 | Kang | G11C 5/147 365/189.09 |
| 7,227,792 | B2 | * | 6/2007 | Takahashi | G11C 5/145 327/538 |
| 7,564,732 | B2 | * | 7/2009 | Im | G11C 5/144 365/226 |
| 7,843,256 | B2 | * | 11/2010 | Do | G05F 1/465 327/540 |
| 2008/0088365 | A1 | | 4/2008 | Jang | |
| 2008/0089143 | A1 | | 4/2008 | Do | |

* cited by examiner

*Primary Examiner* — Son Mai
(74) *Attorney, Agent, or Firm* — William Park & Associates Ltd.

(57) ABSTRACT

A reference selection circuit may be provided. The reference selection circuit may include a plurality of reference drivers configured to respectively output a plurality of reference voltages having different voltage levels, and a plurality of selectors configured to select any one of the plurality of reference voltages based on a selection signal, and output the selected reference voltage to a monitoring pad.

20 Claims, 3 Drawing Sheets

REFERENCE SELECTION CIRCUIT

CROSS-REFERENCE TO RELATED APPLICATION

This application claims priority based upon Korean patent application No. 10-2016-0143070, filed on Oct. 31, 2016, the disclosure of which is hereby incorporated in its entirety by reference herein.

BACKGROUND

1. Technical Field

Embodiments of the present disclosure may generally relate to a reference selection circuit and a semiconductor memory device including the same, and more particularly to a technology relating to the reduction of noise generated from a reference selection buffer.

2. Related Art

A semiconductor memory device generates different levels of internal voltages that are different from external voltages. The external voltages are received from the external part of the semiconductor memory device. The semiconductor memory device appropriately uses the generated internal voltages. For example, the semiconductor memory device generates a core voltage VCORE used in a core region, a reference voltage VREF used in a data buffer, etc., and appropriately uses the generated voltages.

A reference voltage VREF level used in the semiconductor memory device is determined according to a setting value received from the external part.

The Joint Electron Device Engineering Council (JEDEC) specification (SPEC) associated with semiconductor memory devices has defined not only the range of a voltage level of a reference voltage VREF according to change of the setting value, but also the change speed of the reference voltage VREF level based on the changed setting value.

The semiconductor memory device tests a level of the reference voltage generated therein through a voltage monitoring pad. However, due to parasitic capacitors and parasitic resistance of the test devices and lines, noise occurs in a voltage monitoring pad. If noise is applied to the reference selection buffer, a faulty or defective bias occurs.

SUMMARY

In accordance with an embodiment of the present disclosure, a semiconductor memory device may include a reference selection circuit. In accordance with an embodiment of the present disclosure, a reference selection circuit may be provided. The reference selection circuit may include a plurality of reference drivers configured to respectively output a plurality of reference voltages having different voltage levels, and a plurality of selectors configured to select any one of the plurality of reference voltages based on a selection signal, and output the selected reference voltage to a monitoring pad.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a reference selection circuit that substantially obviates one or more problems due to limitations and disadvantages of the related art.

Some embodiments of the present disclosure may relate to technology for preventing noise received from a monitoring pad to prevent the occurrence of a faulty or defective bias.

Figure 1:
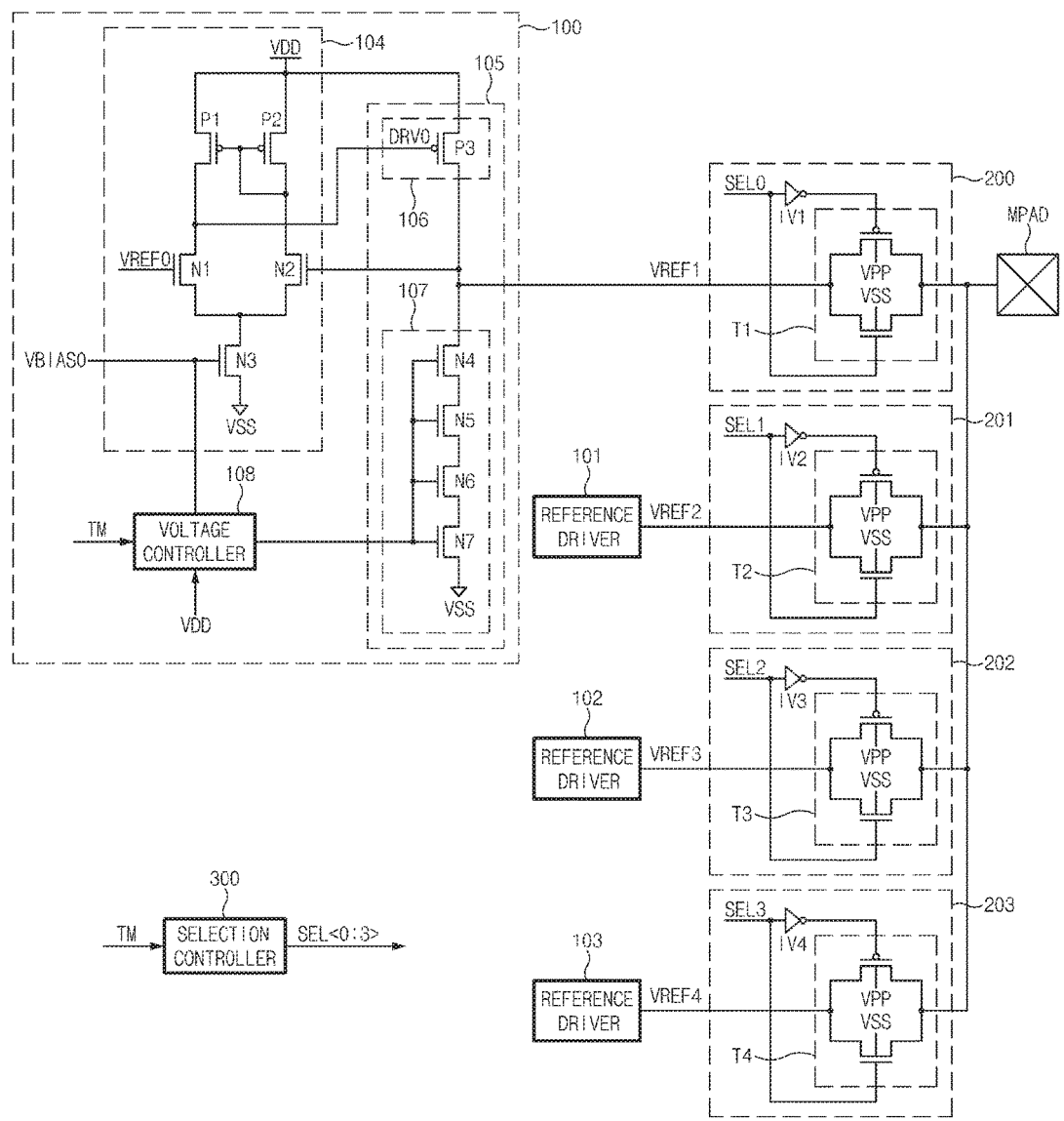
FIG. 1 is a circuit diagram illustrating a representation of an example of a reference selection circuit according to an embodiment of the present disclosure.

FIG. 1 is a circuit diagram illustrating a representation of an example of a reference selection circuit according to an embodiment of the present disclosure. In an embodiment, a semiconductor memory device may include the reference selection circuit.

Referring to FIG. 1, the reference selection circuit according to an embodiment may include a plurality of reference drivers 100 to 103, a plurality of selectors 200 to 203, a selection controller 300, and a monitoring pad MPAD.

The reference driver 100 may output a second reference voltage VREF1. The reference driver 101 may output a third reference voltage VREF2. The reference driver 102 may output a fourth reference voltage VREF3. The reference driver 103 may output a fifth reference voltage VREF4. The reference voltages VREF1 to VREF4 generated from the reference drivers 100 to 103 may have different voltage levels. The monitoring pad MPAD may be coupled to the plurality of selectors 200 to 203, and may be shared by the plurality of reference drivers 100 to 103.

Structures of the reference drivers 100 to 103 may be identical or substantially identical to one another, and as such a structure of the first reference driver 100 will hereinafter be described as an example for convenience of description.

The reference driver 100 may buffer a first reference voltage VREF0 based on a bias voltage VBIAS0, and may output a second reference voltage VREF1 having the same level as the first reference voltage VREF0. The reference driver 100 may include a comparator 104, a driver 105, and a voltage controller 108.

The comparator 104 may compare the first reference voltage VREF0 with the second reference voltage VREF1, and may output a drive signal DRV0 according to the result of comparison. The comparator 104 may include a plurality of PMOS transistors P1 and P2 acting as pull-up drive elements and a plurality of NMOS transistors N1 to N3 acting as pull-down drive elements.

The PMOS transistors P1 and P2 may receive a power-supply voltage VDD through a common source terminal, and gate terminals of the PMOS transistors P1 and P2 are commonly coupled to each other. Drain terminals of the PMOS transistors P1 and P2 may be respectively coupled to the NMOS transistors N1 and N2.

Drain terminals of the NMOS transistors N1 and N2 may be respectively coupled to the PMOS transistors P1 and P2.

A common source terminal of the NMOS transistors N1 and N2 may be coupled to the NMOS transistor N3. The NMOS transistor N1 may receive the first reference voltage VREF0 through a gate terminal thereof. The NMOS transistor N2 may receive the second reference voltage VREF1 through a gate terminal thereof.

The NMOS transistor N3 may be coupled between a ground voltage (VSS) input terminal and a common source terminal of the NMOS transistors N1 and N2, such that the NMOS transistor N3 may receive a bias voltage VBIAS0 through a gate terminal thereof.

The driver 105 may include a pull-up driver 106 and a pull-down driver 107.

The pull-up driver 106 may pull the second reference voltage VREF1 up to a power-supply voltage (VDD) level based on the drive signal DRV0. The pull-up driver 106 may include a PMOS transistor P3 coupled between the power-supply voltage (VDD) input terminal and the second reference voltage (VREF1) output terminal to receive the drive signal DRV0 through a gate terminal thereof.

The pull-down driver 107 may pull the second reference voltage VREF1 down to a ground voltage (VSS) level based on an output signal of the voltage controller 108. The pull-down driver 107 may include a plurality of NMOS transistors N4 to N7. The NMOS transistors N4 to N7 may be coupled in series between a ground voltage (VSS) input terminal and a second reference voltage (VREF1) output terminal, such that the NMOS transistors N4 to N7 may receive the output signal of the voltage controller 108 through a common gate terminal. Although the number of NMOS transistors N4 to N7 according to an embodiment is, for example, set to 4 for convenience of description, the number of transistors used in the embodiments are not limited thereto.

The voltage controller 108 may control a voltage applied to the pull-down driver 107 based on a test mode signal TM. For example, the voltage controller 108 may output a bias voltage VBIAS0 to the pull-down driver 107 during deactivation of the test mode signal TM. For example, the voltage controller 108 may output a power-supply voltage VDD higher in level than the bias voltage VBIAS0 to the pull-down driver 107 during activation of the test mode signal TM.

The plurality of selectors 200 to 203 may selectively output any one of the output reference voltages VREF1 to VREF4 received from the plurality of reference drivers 100 to 103 to the monitoring pad MPAD based on the respective selection signals SEL0 to SEL3. Although the number of the selectors 200 to 203 is, for example, set to 4 for convenience of description, the scope or spirit of the number of selectors according to the embodiments are not limited thereto.

For example, the selectors 200 to 203 may respectively correspond to the selection signals SEL0 to SEL3, such that the selectors 200 to 203 may select any one reference voltage from among the reference voltages generated from the plurality of reference drivers 100 to 103, and may output the selected reference voltage to the monitoring pad MPAD. In addition, the selection controller 300 may activate any one of the plurality of selection signals SEL0 to SEL3 (SEL<0:3>) based on the test mode signal TM, and may output the activated selection signal.

The selector 200 may include an inverter IV1 and a transfer gate (TG) T1. The transfer gate T1 may selectively output a second reference voltage VREF1 to the monitoring pad MPAD based on the selection signal SEL0. For example, when the selection signal SEL0 is at a logic high level, the transfer gate T1 may be turned on such that the selector 200 may output the second reference voltage VREF1 to the monitoring pad MPAD.

The selector 201 may include an inverter IV2 and a transfer gate T2. The transfer gate T2 may selectively output the third reference voltage VREF2 to the monitoring pad MPAD based on the selection signal SEL1. For example, when the selection signal SEL1 is at a logic high level, the transfer gate T2 may be turned on such that the selector 201 may output the second reference voltage VREF2 to the monitoring pad MPAD.

The selector 202 may include an inverter IV3 and a transfer gate T3. The transfer gate T3 may selectively output the fourth reference voltage VREF3 to the monitoring pad MPAD based on the selection signal SEL2. For example, when the selection signal SEL2 is at a logic high level, the transfer gate T3 may be turned on such that the selector 202 may output the fourth reference voltage VREF3 to the monitoring pad MPAD.

The selector 203 may include an inverter IV4 and a transfer gate T4. The transfer gate T4 may selectively output the fifth reference voltage VREF4 to the monitoring pad MPAD based on the selection signal SEL3. For example, when the selection signal SEL3 is at a logic high level, the transfer gate T4 may be turned on such that the selector 203 may output the fifth reference voltage VREF4 to the monitoring pad MPAD.

Although an embodiment has, for example, disclosed that the monitoring pad MPAD measures the same reference voltage level as the reference voltages VREF1 to VREF3 for convenience of description, the scope or spirit of the embodiments of the present disclosure are not limited thereto, and the monitoring pad MPAD may also measure bias-based voltages, for example, a pumping voltage VPP, a core voltage VCORE, a back-bias voltage VBB, etc.

According to an above-mentioned embodiment, when the bias voltage VBIAS0 is activated, the comparator 104 of the reference driver 100 may operate to compare the first reference voltage VREF0 with the second reference voltage VREF1, and may output a drive signal DRV0.

The pull-up driver 106 may be controlled based on the drive signal DRV0, and the pull-down driver 107 may be controlled based on an output signal of the voltage controller 108, such that a voltage level of the second reference voltage VREF1 may be controlled.

In other words, when a voltage level of the drive signal DRV0 is lowered, the pull-up driver 106 is turned on to provide a power-supply voltage VDD, such that a voltage level of the second reference voltage VREF1 may increase. For example, when the second reference voltage VREF1 increases in level, the pull-down driver 107 is turned on to provide a ground voltage VSS, such that a voltage level of the second reference voltage VREF1 may be lowered. If the selection signal SEL0 is activated, the second reference voltage VREF1 may be output to the monitoring pad MPAD.

Based on activation or deactivation of the test mode signal TM, the voltage controller 108 may provide the bias voltage VBIAS0 as a gate voltage of the pull-down driver 107, or may provide a power-supply voltage (VDD) higher in level than the bias voltage VBIAS0 as a gate voltage of the pull-down driver 107. Accordingly, based on the test mode signal TM, an off-leakage received through a transfer node of the second reference voltage VREF1 may be quickly grounded to a pull-down node.

A semiconductor device (e.g., DRAM) may measure various internal bias voltages and reference levels through a single monitoring pad MPAD. Noise generated from the monitoring pad MPAD may be applied to a reference selection circuit, resulting in occurrence of a faulty or defective bias voltage.

Unique characteristics of transistors used in various circuits such as the monitoring pad MPAD are gradually vulnerable to off-leakage in proportion to increasing technology shrink of semiconductor devices. As a result, substantial noise may occur in the monitoring pad MPAD in which various bias voltages are input and output.

If noise occurs in the monitoring pad MPAD, the noise may be applied to the reference drivers 100 to 103, each of which generates a relatively low level. During a test procedure, the bias voltage level may be changed according to various modes, such that a test margin is guaranteed. As a result, the generated noise may affect the reference level, resulting in occurrence of an abnormal bias voltage level.

For example, it is assumed that the selection signal SEL1 is activated so that the reference driver 101 is selected. In this case, under the condition that the selector 200 must be turned off due to deactivation of the selection signal SEL0, off-leakage may be applied to the reference driver 100 through the selector 200 due to noise generated in the monitoring pad MPAD.

For example, a pumping voltage VPP applied to a bulk of the transfer gate T1 is changed during the test procedure. If the pumping voltage VPP increases, off-leakage may occur in the reference driver 100 through the selector 200. For example, such off-leakage may greatly increase in a specific structure in which the monitoring pad MPAD is shared by the plurality of reference drivers 100 to 103.

As a result, when the test mode signal TM is deactivated during a normal operation, the bias voltage VBIAS0 may be applied to the comparator 104 and the pull-down driver 107. That is, in order to guarantee operational stability as well as to reduce power consumption during normal operation, the bias voltage VBIAS0 lower in level than the power-supply voltage VDD may be supplied to the comparator 104 and the pull-down driver 107.

For example, when the test mode signal TM is activated, the power-supply voltage VDD higher in level than the bias voltage VBIAS0 may be supplied to the pull-down driver 107. For example, when entering a specific mode in which the pumping voltage VPP increases during the test mode, the power-supply voltage VDD may be supplied to the pull-down driver 107 by the test mode signal TM. As a result, a driving capability of the pull-down driver 107 increases and a response speed becomes faster, such that increase in that the second reference voltage VREF1 to a high level by noise is prevented.

Therefore, noise generated in the monitoring pad MPAD quickly flows to the ground voltage terminal through the pull-down driver 107, such that the reference selection circuit according to an embodiment becomes insensitive to noise. That is, when a high voltage is applied to a gate terminal of the pull-down driver 107, noise caused by the monitoring pad MPAD is reduced. In addition, during normal operation, the bias voltage VBIAS0 is supplied to the pull-down driver 107, such that current consumption does not increase.

Figure 2:
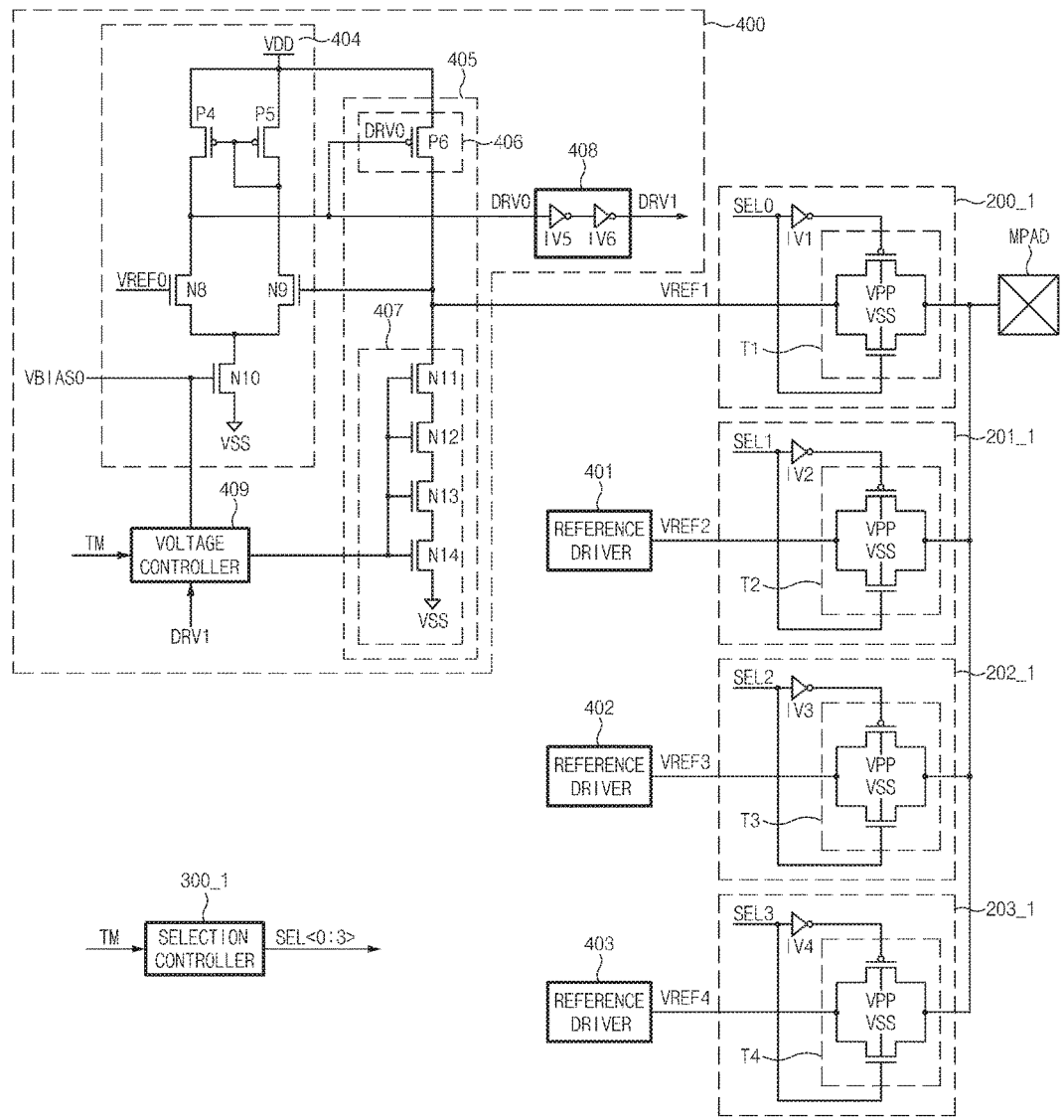
FIG. 2 is a circuit diagram illustrating a representation of an example of a reference selection circuit according to an embodiment of the present disclosure.

FIG. 2 is a circuit diagram illustrating a representation of an example of a reference selection circuit according to an embodiment of the present disclosure. In an embodiment, a semiconductor memory device may include the reference selection circuit.

Referring to FIG. 2, the reference selection circuit may include a plurality of reference drivers 400 to 403, a plurality of selectors 200_1 to 203_1, a selection controller 300_1, and a monitoring pad MPAD. The selectors 200_1 to 203_1 of FIG. 2 are identical to those of FIG. 1, and as such a description thereof will herein be omitted for convenience of description.

Referring to FIG. 2, the reference driver 400 may output a second reference voltage VREF1, and the reference driver 401 may output a third reference voltage VREF2. The reference driver 402 may output a fourth reference voltage VREF3, and the reference driver 403 may output a fifth reference voltage VREF4. The reference voltages VREF1 to VREF3 generated from the reference drivers 400 to 403 may have different voltage levels. The monitoring pad MPAD may be coupled to the plurality of selectors 200_1 to 203_1, and may be shared by the plurality of reference drivers 400 to 403.

Structures of the reference drivers 400 to 403 are identical to each other or substantially identical to each other and, as such, a structure of the first reference driver 400 of FIG. 2 will hereinafter be described as an example.

The reference driver 400 may buffer the first reference voltage VREF0 based on the bias voltage VBIAS0, and may output the second reference voltage VREF1 having the same level as the first reference voltage VREF0. The reference driver 400 may include a comparator 404, a driver 405, a delay portion 408, and a voltage controller 409.

The comparator 404 may compare the first reference voltage VREF0 with the second reference voltage VREF1, and may thus output a drive signal DRV0. The comparator 404 may include a plurality of PMOS transistors P4 and P5 and a plurality of NMOS transistors N8 to N10.

The PMOS transistors P4 and P5 may receive a power-supply voltage VDD through a common source terminal, and gate terminals thereof are commonly coupled to each other. Drain terminals of the PMOS transistors P4 and P5 may be coupled to the NMOS transistors N8 and N9, respectively.

Drain terminals of the NMOS transistors N8 and N9 may be coupled to the PMOS transistors P4 and P5, respectively. A common source terminal of the NMOS transistors N8 and N9 may be coupled to the NMOS transistor N10. In addition, the NMOS transistor N8 may receive the first reference voltage VREF0 through a gate terminal thereof, and the NMOS transistor N0 may receive the second reference voltage VREF1 through a gate terminal thereof.

The NMOS transistor N10 may be coupled between a common source terminal of the NMOS transistors N8 and N9 and a ground voltage (VSS) input terminal, and may receive the bias voltage VBIAS0 through a gate terminal thereof.

The driver 405 may include a pull-up driver 406 and a pull-down driver 407.

Here, the pull-up driver 406 may pull the second reference voltage VREF1 up to the power-supply voltage (VDD) level based on the drive signal DRV0. The pull-up driver 406 may include a PMOS transistor P6. The PMOS transistor P6 is coupled between the power-supply voltage (VDD) input terminal and the second reference voltage (VREF1) output terminal, and receives the drive signal DRV0 through a gate terminal thereof.

The pull-down driver 407 may pull the second reference voltage VREF1 down to the ground voltage (VSS) level based on an output signal of the voltage controller 409. The pull-down driver 407 may include a plurality of NMOS transistors N11 to N14. The NMOS transistors N11 to N14 may be coupled in series between the second reference voltage (VREF1) output terminal and the ground voltage (VSS) input terminal, such that the NMOS transistors N11 to N14 may receive the output signal of the voltage controller 409 through a common gate terminal. Although the number of NMOS transistors N11 to N14 is exemplarily set to 4 for convenience of description, it should be noted that the number of transistors according to the embodiments are not limited thereto.

The delay portion 408 may delay the drive signal DRV0, and may output a delay signal DRV1 to the voltage controller 409. The delay portion 408 may include inverters IV5 and IV6 configured to perform non-inverting delay of the drive signal DRV0 to output the delay signal DRV1.

The voltage controller 409 may control the voltage applied to the pull-down driver 407 based on the test mode signal TM. For example, the voltage controller 409 may output the bias voltage VBIAS0 to the pull-down driver 407 during deactivation of the test mode signal TM. For example, during activation of the test mode signal TM, the voltage controller 409 may compare a level of the delay signal DRV1 with a level of the bias voltage VBIAS0, and may output a higher-level voltage to the pull-down driver 407.

For example, when the second reference voltage VREF1 increases in level, the voltage level of the drive signal DRV0 may also increase. As a result, a gate voltage supplied to the pull-up driver 406 increases in level, such that the second reference voltage VREF1 decreases in level.

According to an embodiment of FIG. 2, if the second reference voltage VREF1 unnecessarily increases in level, this means that off-leakage is received from the monitoring pad MPAD. As a result, the voltage level of the drive signal DRV0 may increase based on the level of the second reference voltage VREF1. The delay signal DRV1 corresponding to the drive signal DRV0 is compared with the bias voltage (VBIAS0) level, such that a higher-level voltage from among the two voltages is supplied to the pull-down driver 407, resulting in cancellation of noise.

According to an embodiment of the present disclosure, if the bias voltage VBIAS0 is activated, the comparator 404 of the reference driver 400 may operate to compare the first reference voltage VREF0 with the second reference voltage VREF1, and may output the delay signal DRV1. The pull-up driver 406 may be controlled based on the drive signal DRV0, the pull-down driver 407 may be controlled based on the output signal of the voltage controller 409, such that a voltage level of the second reference voltage VREF1 is controlled.

In other words, if the voltage level of the drive signal DRV0 is lowered, the pull-up driver 406 is turned on to provide the power-supply voltage VDD, such that the voltage level of the second reference voltage VREF1 may increase. For example, if the second reference voltage VREF1 increases, the pull-down driver 407 is turned on to provide the ground voltage VSS, such that the voltage level of the second reference voltage VREF1 may decrease. If the selection signal SEL0 is activated, the second reference voltage VREF1 may be output to the monitoring pad MPAD.

Based on activation or deactivation of the test mode signal TM, the voltage controller 409 may output the bias voltage VBIAS0 as a gate voltage of the pull-down driver 407 or may output the delay signal DRV1 as a gate voltage of the pull-down driver 407. Accordingly, based on the test mode signal TM, an off-leakage received through a transfer node of the second reference voltage VREF1 may be quickly grounded to a pull-down node.

Figure 3:
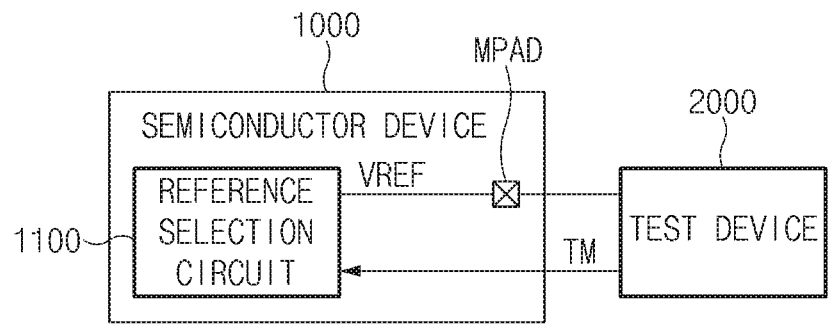
FIG. 3 is a block diagram illustrating a representation of an example of a semiconductor device including a reference selection circuit according to an embodiment of the present disclosure.

FIG. 3 is a block diagram illustrating a representation of an example of a semiconductor device 1000 including a reference selection circuit 1100 according to an embodiment of the present disclosure.

Referring to FIG. 3, the semiconductor device 1000 may test a level of the reference voltage VREF generated in a memory device through the monitoring pad MPAD. Upon receiving a setting value from a test device 2000, the semiconductor device 1000 may establish the level of the reference voltage VREF acting as an internal voltage generated in the semiconductor device 1000.

The test mode signal TM for selecting the reference voltage (VREF) level may be transferred from the test device 2000 to the semiconductor device 1000. During the test mode, upon receiving the setting value, the reference selection circuit 1100 of the semiconductor device 1000 may output the reference voltage VREF generated in the semiconductor device 1000 through the monitoring pad MPAD.

The reference voltage VREF applied to the monitoring pad MPAD may be transferred to the test device 2000. The test device 2000 may measure the level of the reference voltage VREF generated in the semiconductor device 1000.

As is apparent from the above description, an embodiment of the present disclosure may prevent the reference selection buffer from being unstable due to noise generated by the external environment, resulting in implementation of a stable bias level.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the embodiments should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosure or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:
1. A reference selection circuit comprising:
    a plurality of reference drivers configured to respectively output a plurality of reference voltages having different voltage levels; and
    a plurality of selectors configured to select any one of the plurality of reference voltages based on a selection signal, and output the selected reference voltage to a monitoring pad,
    wherein each of the reference drivers includes:
        a comparator configured to compare a first reference voltage with a second reference voltage, and output a drive signal;

a driver configured to pull up the second reference voltage based on the drive signal or pull down the second reference voltage based on a test mode signal; and a voltage controller configured to output different drive voltages to the driver based on the test mode signal.

2. The reference selection circuit according to claim 1, wherein an activation state of the driver is controlled by a bias voltage.

3. The reference selection circuit according to claim 1, wherein the driver includes:

a pull-up driver configured to pull up the second reference voltage based on the drive signal; and a pull-down driver configured to pull down the second reference voltage based on an output signal of the voltage controller.

4. The reference selection circuit according to claim 3, wherein the pull-up driver includes:

a pull-up drive element coupled between a power-supply voltage input terminal and an output terminal of the second reference voltage, and controlled by the drive signal.

5. The reference selection circuit according to claim 3, wherein the pull-down driver includes:

a plurality of pull-down drive elements coupled in series between an output terminal of the second reference voltage and a ground voltage terminal, and configured to receive the output signal of the voltage controller through a common gate terminal.

6. The reference selection circuit according to claim 5, wherein the voltage controller is configured to output a first drive voltage or a second drive voltage to gate terminals of the plurality of pull-down drive elements based on the test mode signal.

7. The reference selection circuit according to claim 6, wherein:

when the test mode signal is deactivated, the voltage controller outputs the first drive voltage to gate terminals of the plurality of pull-down drive elements; and when the test mode signal is activated, the voltage controller outputs the second drive voltage higher in level than the first drive voltage to gate terminals of the plurality of pull-down drive elements.

8. The reference selection circuit according to claim 6, wherein the first drive voltage is a bias voltage level, wherein the second drive voltage is a power-supply voltage level, wherein the first drive voltage is lower in level than the second drive voltage having a power-supply voltage level.

9. The reference selection circuit according to claim 1, further comprising:

a selection controller configured to control the selection signal based on the test mode signal, the monitoring pad through which one reference voltage selected from among the plurality of reference voltages is input or output, wherein the monitoring pad is shared by the plurality of reference drivers.

10. The reference selection circuit according to claim 1, wherein, during a normal operation, the test mode signal is deactivated and a bias voltage lower in level than a power-supply voltage is supplied to the comparator and the driver, and wherein, during a test mode, the test mode signal is activated and the power-supply voltage is supplied to the driver.

11. A reference selection circuit comprising:

a plurality of reference drivers configured to respectively output a plurality of reference voltages having different voltage levels; and a plurality of selectors configured to select any one of the plurality of reference voltages based on a selection signal, and output the selected reference voltage to a monitoring pad, wherein each of the reference drivers includes:

a comparator configured to compare a first reference voltage with a second reference voltage, and output a drive signal;

a delay portion configured to delay the drive signal by a predetermined time, and output a delay signal;

a driver configured to pull up the second reference voltage based on the drive signal or pull down the second reference voltage based on a test mode signal; and a voltage controller configured to output a bias voltage or a voltage of the delay signal to the driver, upon receiving the test mode signal.

12. The reference selection circuit according to claim 11, wherein an activation state of the driver is controlled by the bias voltage.

13. The reference selection circuit according to claim 11, wherein the driver includes:

a pull-up driver configured to pull up the second reference voltage based on the drive signal; and a pull-down driver configured to pull down the second reference voltage based on an output signal of the voltage controller.

14. The reference selection circuit according to claim 13, wherein the pull-up driver includes:

a pull-up drive element coupled between a power-supply voltage input terminal and an output terminal of the second reference voltage, and controlled by the drive signal.

15. The reference selection circuit according to claim 13, wherein the pull-down driver includes:

a plurality of pull-down drive elements coupled in series between an output terminal of the second reference voltage and a ground voltage terminal, and configured to receive the output signal of the voltage controller through a common gate terminal.

16. The reference selection circuit according to claim 13, wherein the voltage controller compares a voltage level of the delay signal with a level of the bias voltage based on the test mode signal, and outputs a higher-level voltage to a gate terminal of the pull-down driver.

17. The reference selection circuit according to claim 13, wherein:

when the test mode signal is deactivated, the voltage controller outputs the bias voltage to the gate terminal of the pull-down driver; and when the test mode signal is activated, the voltage controller selectively outputs the bias voltage or a voltage of the delay signal to the gate terminals of the plurality of pull-down drive elements.

18. The reference selection circuit according to claim 11, further comprising:

the monitoring pad through which the plurality of reference voltages are input or output, and configured to be shared by the plurality of reference drivers.

19. A reference selection circuit comprising:

a plurality of reference drivers configured to respectively output a plurality of reference voltages having different voltage levels; and a plurality of selectors configured to select any one of the plurality of reference voltages based on a selection signal, and output the selected reference voltage to a monitoring pad, wherein each of the reference drivers includes:

a comparator configured to compare a first reference voltage with a second reference voltage, and output a drive signal; and a driver configured to pull up the second reference voltage based on the drive signal or pull down the second reference voltage with either the drive signal or a bias voltage, depending on whether the drive signal or the bias voltage has a higher-level voltage from among the two voltages.

20. The reference selection circuit according to claim 19, further comprising:

a delay portion configured to delay the drive signal by a predetermined time, and output a delay signal; and a voltage controller configured to output a bias voltage or a voltage of the delay signal to the driver, upon receiving the test mode signal.

* * * * *